(12) United States Patent
Sato (10) Patent No.: US 11,336,858 B2
(45) Date of Patent: May 17, 2022

(54) IMAGE CAPTURING DEVICE AND METHOD THAT CONTROL AN EXPOSURE PERIOD OF A PHOTON-COUNTING TYPE OF AN IMAGE SENSOR

(71) Applicant: CANON KABUSHIKI KAISHA, Tokyo (JP)

(72) Inventor: Yuko Sato, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 156 days.

(21) Appl. No.: 16/821,391

(22) Filed: Mar. 17, 2020

(65) Prior Publication Data
US 2020/0304745 A1 Sep. 24, 2020

(30) Foreign Application Priority Data
Mar. 19, 2019 (JP) .............................. JP2019-051507

(51) Int. Cl.
*H04N 5/378* (2011.01)
*H01L 27/146* (2006.01)
*H04N 5/341* (2011.01)

(52) U.S. Cl.
CPC ....... *H04N 5/378* (2013.01); *H01L 27/14645* (2013.01); *H04N 5/341* (2013.01)

(58) Field of Classification Search
CPC ........ H04N 5/378; H04N 5/341; H04N 5/353; H04N 5/37455; H01L 27/14645
See application file for complete search history.

(56) References Cited

U.S. PATENT DOCUMENTS

| 2016/0266054 A1* | 9/2016 | Cao ........................ A61B 6/032 |
| 2018/0278877 A1* | 9/2018 | Yamahira ............... H04N 5/355 |
| 2018/0343406 A1* | 11/2018 | Ikedo ..................... H04N 5/369 |
| 2019/0182442 A1* | 6/2019 | Ikedo ................. H04N 5/37455 |

FOREIGN PATENT DOCUMENTS

JP 2011-082634 A 4/2011

* cited by examiner

*Primary Examiner* — Gevell V Selby
(74) *Attorney, Agent, or Firm* — Cowan, Liebowitz & Latman, P.C.

(57) ABSTRACT

An image capturing device comprising: an image sensing element having a plurality of pixels each including a sensor that outputs a pulse signal in response to incident of a photon, and a counter that counts a number of the pulse signals; a readout unit that reads out count information from the counters; a control unit that controls the readout unit so as to read out the count information from the counters of at least a part of the plurality of the pixels at a predetermined timing during exposure of the pixels; and a determination unit that determines whether the read out count information satisfies a predetermined condition, wherein, in a case where the predetermined condition is satisfied, counting by the counters is stopped.

12 Claims, 9 Drawing Sheets

| R | Gr | R | Gr | R | Gr |
|---|----|---|----|---|----|
| Gb | B | Gb | B | Gb | B |
| R | Gr | R | Gr | R | Gr |
| Gb | B | Gb | B | Gb | B |
| R | Gr | R | Gr | R | Gr |
| Gb | B | Gb | B | Gb | B |

IMAGE CAPTURING DEVICE AND METHOD THAT CONTROL AN EXPOSURE PERIOD OF A PHOTON-COUNTING TYPE OF AN IMAGE SENSOR

BACKGROUND OF THE INVENTION

Field of the Invention

The present invention relates to an image capturing device using an avalanche photodiode and more particularly to technique for controlling an exposure time in image capturing processing.

Description of the Related Art

In recent years, as an image sensor used for a digital camera or the like, a photon counting type image sensor capable of non-destructively reading an image signal has been studied. This image sensor directly counts the number of incident photons and outputs the number as a digital signal by utilizing an avalanche phenomenon occurring when an avalanche photodiode (APD) is operated in Geiger mode. Such an image sensor is called SPAD (Single Photon Avalanche Diode).

When an APD is operated in Geiger mode, a current of observable level is produced by the avalanche phenomenon when a single photon enters the APD, for example. By converting the current into a pulse signal and counting the number of pulse signals, the number of incoming photons can be measured directly. As such, SPAD is less affected by influence of noise, and an improvement in the S/N ratio can be anticipated. Japanese Patent Laid-Open No. 2011-82634 discloses a distance-measurement sensor constituted by the SPAD having a plurality of pixels as an example of a sensing device employing SPAD.

Figure 9A:
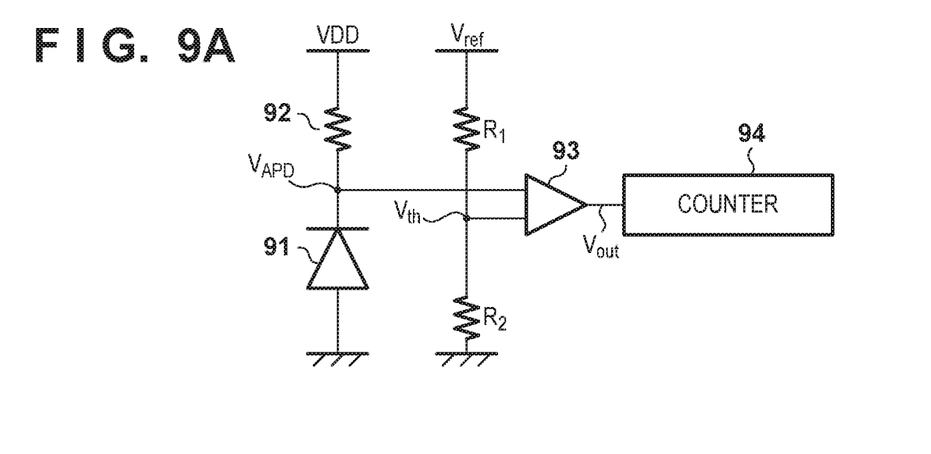
FIGS. 9A to 9C are diagrams pertaining to a photon counting type image sensor according to a conventional technique.

An overview of the operations of a conventional photon counting type image sensor will be given here using FIGS. 9A to 9C. FIG. 9A illustrates an equivalent circuit of a unit pixel (called simply a "pixel" hereinafter) of an image sensor in which the APDs operate in Geiger mode. The pixel is constituted by an APD 91, a quenching resistor 92, a comparator 93, and resistors $R_1$ and $R_2$.

The anode end of the APD 91 is grounded, while the cathode end is connected to the quenching resistor 92. A reverse bias voltage from a voltage HVDD is applied via the quenching resistor 92. At this time, a voltage difference between the voltage HVDD and GND is set to be greater than or equal to a breakdown voltage for making the APD 91 operate in Geiger mode.

Figures 9B, 9C:
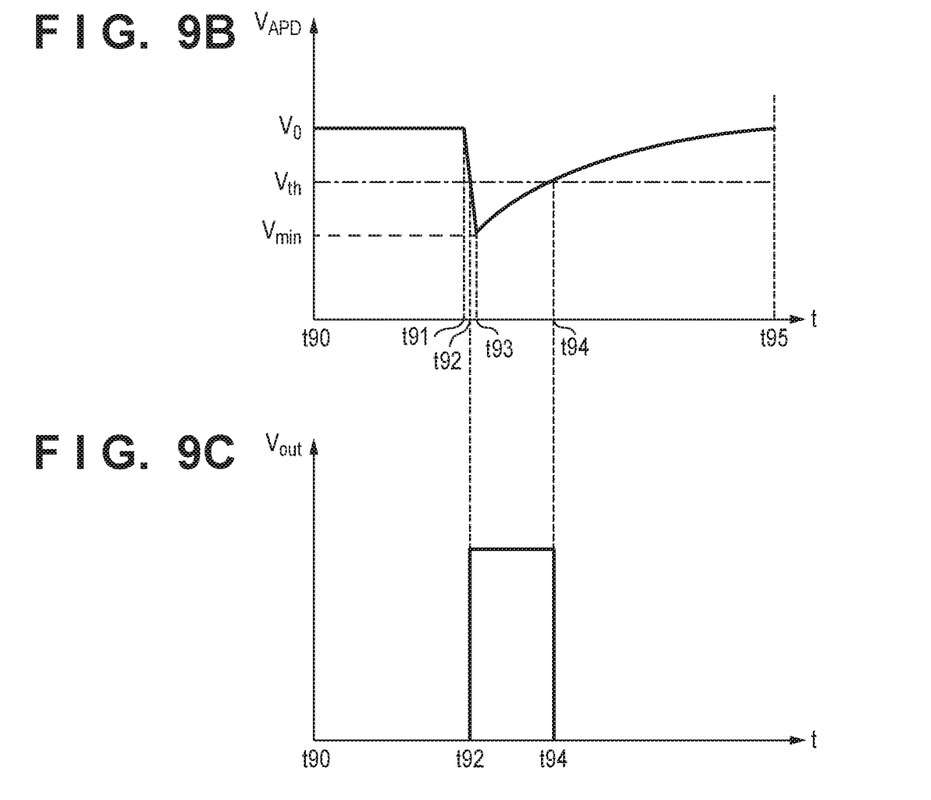

FIG. 9B illustrates a transition of a voltage $V_{APD}$ at the cathode end of the APD 91 from a photon waiting state to the occurrence of the avalanche phenomenon, and further to the photon waiting state again. A period from time t90 to t91 corresponds to the photon waiting state, and when a photon enters the APD 91 at time t91, the avalanche phenomenon occurs. When the avalanche phenomenon occurs, a current flows and the voltage $V_{APD}$ drops, and the avalanche phenomenon stops (time t93), and returns to the original photon waiting state (time t95).

As illustrated in FIG. 9A, the voltage $V_{APD}$ at the cathode end of the APD 91 is input to one input terminal of the comparator 93, and a threshold voltage $V_{th}$ obtained by dividing a reference voltage $V_{ref}$ with the resistor $R_1$ and the resistor $R_2$ is input to the other input terminal. The threshold voltage $V_{th}$ is set to a potential between $V_0$ and $V_{min}$ so that a change in the voltage $V_{APD}$ can be detected when a photon enters, as described above.

The comparator 93 outputs a single pulse signal during the period from when the voltage $V_{APD}$ drops below $V_{th}$ to when the voltage $V_{APD}$ once again surpasses the $V_{th}$ (a period in which the voltage $V_{APD}$ falls below and returns above the $V_{th}$ level).

FIG. 9C shows the output $V_{out}$ of the comparator 93 when the voltage $V_{APD}$ at the cathode terminal of the APD 91 changes as shown in FIG. 9B. At time t92, the voltage $V_{APD}$ becomes smaller than $V_{th}$, and at time t94, $V_{APD}$ becomes larger than $V_{th}$ again. Therefore, one pulse signal is output in the period from t92 to t94.

If a counter 94 is connected to the comparator 93, the number of incident photons can be counted. Therefore, the number of photons incident on the APD 91 can be counted as the cycle of occurrence of the avalanche phenomenon from the photon waiting state, stop of the avalanche phenomenon, and return to the original photon waiting state is repeated.

In an image sensor using an APD disclosed in Japanese Patent Laid-Open No. 2011-82634, the signal of some pixels is read out during exposure and added to the signal of pixels for one frame after the end of exposure. Since an S/N ratio does not deteriorate, the image quality does not decrease. However, since an amount of pixel readout information is large, the pixel readout interval is increased, and the accuracy of exposure time control is reduced.

SUMMARY OF THE INVENTION

The present invention has been made in consideration of the above situation, and accurately controls an exposure period of a photo-counting type image sensor.

According to the present invention, provided is an image capturing device comprising: an image sensing element having a plurality of pixels each including a sensor that outputs a pulse signal in response to incident of a photon, and a counter that counts a number of the pulse signals; a readout unit that reads out count information from the counters; a control unit that controls the readout unit so as to read out the count information from the counters of at least a part of the plurality of the pixels at a predetermined timing during exposure of the pixels; and a determination unit that determines whether the read out count information satisfies a predetermined condition, wherein, in a case where the predetermined condition is satisfied, counting by the counters is stopped, and wherein each unit is implemented by one or more processors, circuitry or a combination thereof.

According to the present invention, provided is an image capturing device comprising: an image sensing element having a plurality of pixels each including a sensor that outputs a pulse signal in response to incident of a photon, and a counter that counts a number of the pulse signals; a readout unit that reads out count information from the counters; a control unit that controls the readout unit so as to repeatedly read out the count information from the counters of at least a part of the plurality of the pixels at a predetermined timing during exposure of the pixels; a display unit that displays the count information read out by the readout unit under control by the control unit; and an operation unit that inputs an instruction to stop counting in the counters, wherein, in a case where the instruction is input by the operation unit, counting by the counters is stopped, and wherein each unit is implemented by one or more processors, circuitry or a combination thereof.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

First Embodiment

Figure 1:
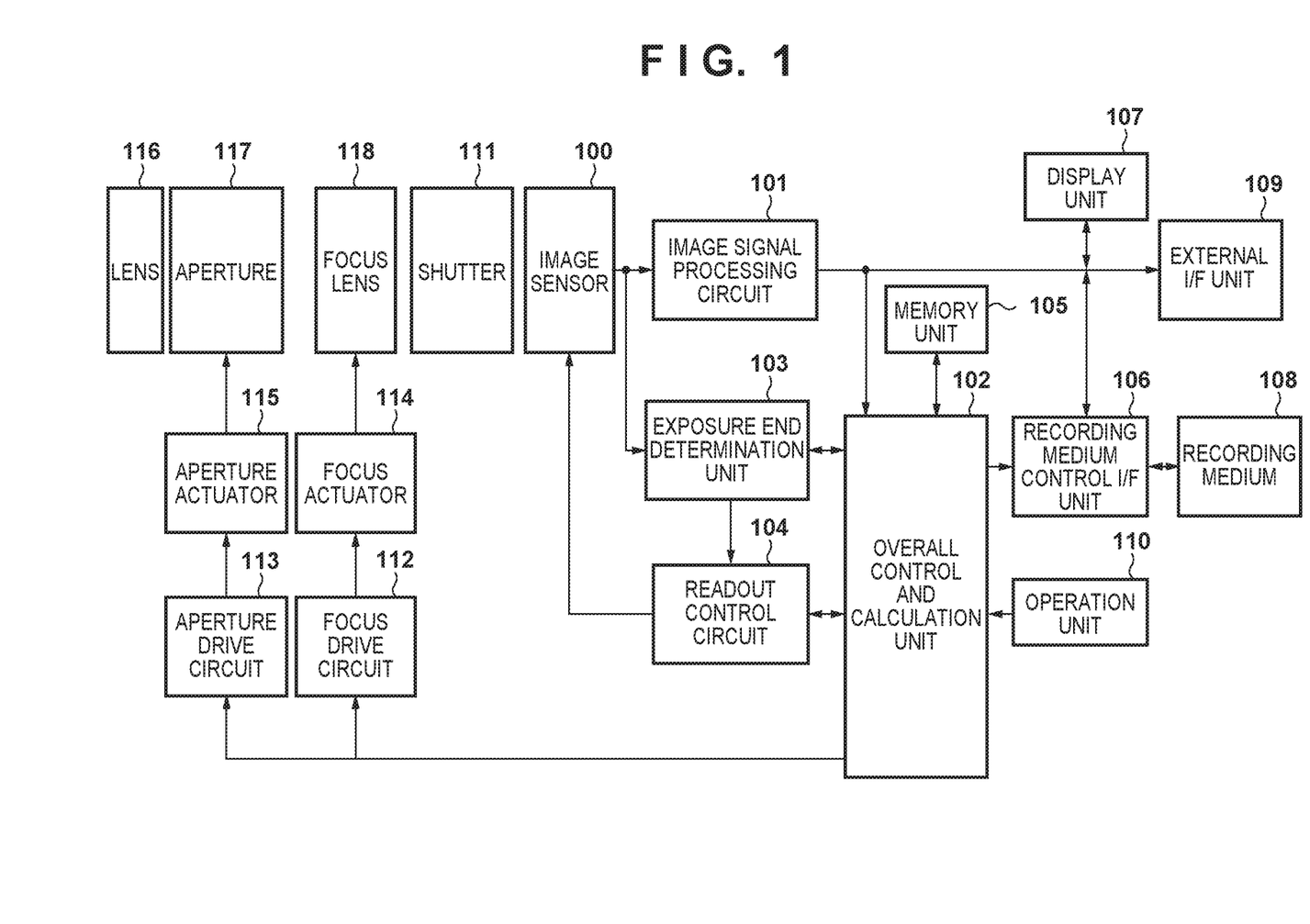
FIG. 1 is a block diagram illustrating an overall configuration of an image capturing apparatus according to an embodiment.

Hereinafter, a configuration of an image capturing apparatus will be described with reference to FIG. 1 as an example of an image capturing device according to a first embodiment of the present invention. FIG. 1 is a block diagram illustrating an overall configuration of an image capturing apparatus according to an embodiment;

In FIG. 1, an imaging optical system includes a first lens group 116, an aperture 117, and a second lens group 118. The first lens group 116 is disposed at the tip of the imaging optical system, and moves forward and backward in an optical axis direction, thereby realizing a zooming function. An aperture of the aperture 117 is controlled by an aperture drive circuit 113 via an aperture actuator 115 to adjust the amount of light during shooting. The second lens group 118 includes a focus lens, and a focus drive circuit 112 drives the second lens group 118 via a focus actuator 114 to reciprocally move in the optical axis direction to adjust the focus of the imaging optical system.

A shutter 111 is a focal plane shutter that adjusts the exposure period when shooting a still image. In this embodiment, the exposure period of an image sensor 100 is adjusted by the shutter 111, however, the present invention is not limited to this. The image sensor 100 may have an electronic shutter function, and the exposure period may be adjusted by a control pulse.

The image sensor 100 is an imaging device in which each pixel has an avalanche photodiode (APD), and counts the number of photons entering via the imaging optical system, and outputs the count number (pixel value). The detailed configuration of the image sensor 100 will be described later with reference to FIGS. 2A and 2B and FIGS. 3A and 3B.

An image signal processing circuit 101 performs various image signal processing, such as low-pass filter processing for reducing noise, shading correction processing, and WB correction processing, as well as various corrections, such as flaw correction, dark shading correction, and dark current removal, compression, and so on, on pixel values input from the image sensor 100 and generates image data.

An overall control and calculation unit 102 performs overall control of the image capturing apparatus and various calculations. An exposure end determination unit 103 determines an exposure end timing based on the pixel value output from the image sensor 100. A readout control circuit 104 generates a drive pulse for driving the image sensor 100 based on the control signal from the overall control and calculation unit 102 and the determination result of the exposure end determination unit 103.

A memory unit 105 temporarily stores image data generated by the image signal processing circuit 101. A recording medium control interface (I/F) unit 106 records or reads image data on/from a recording medium 108. A display unit 107 displays image data. The recording medium 108 is a detachable storage medium such as a semiconductor memory, to/from which image data is recorded and read out. An external interface (I/F) unit 109 is an interface for communicating with an external computer or the like.

Information about the driving conditions of the image capturing apparatus set by the user using an operation unit 110 is sent to the overall control and calculation unit 102, and overall control of the image capturing apparatus is performed based on the information. The operation unit 110 includes a power button and a still image recording button (not shown). By turning on/off the power button, the image capturing apparatus can be turned on/off. By turning on the still image recording button while the image capturing apparatus is on, it is possible to instruct to start recording a still image.

Note that the image capturing apparatus having the above-described configuration can capture a still image and/or a moving image.

Figure 2A:
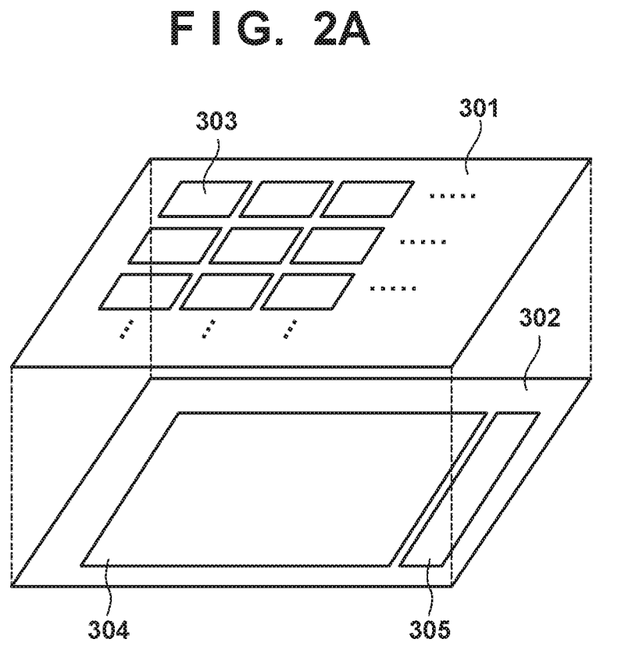
FIGS. 2A and 2B are diagrams illustrating a configuration of an image sensor according to the embodiment.
Figure 2B:
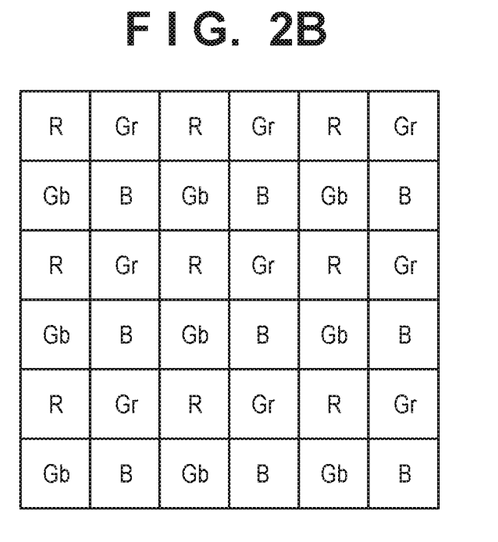

FIGS. 2A and 2B illustrate the overall structure of the image sensor 100. In the present embodiment, as an example, a sensor substrate 301 and a circuit board 302 are stacked so as to be electrically connected, providing the image sensor with a stacked structure.

As illustrated in FIG. 2A, a pixel array is formed on the sensor substrate 301 by arranging a plurality of pixels 303 two-dimensionally. The configuration of the pixel 303 will be described in greater detail later. A pixel computation unit 304 and a signal processing circuit 305 are formed on the circuit board 302.

The pixel computation unit 304 is electrically connected to the pixels on the sensor substrate 301 by bumps or the like. The pixel computation unit 304 outputs control signals for driving the pixels 303, and carries out various types of processing upon receiving comparator outputs from the pixels 303.

The pixel computation unit 304 includes a counter circuit that measures the number of pulse signals from the comparators output in response to photons entering the corresponding pixels, as will be explained later. A count value obtained by the pixel computation unit 304 is output to the exterior of the image sensor 100 by the signal processing circuit 305.

FIG. 2B is a diagram illustrating part of a color filter array used in the image sensor 100, and included in the pixel array illustrated in FIG. 2A. This color filter arrangement is known as a Bayer array, in which a first color filter of red (R), a second color filter of green (Gr), a third color filter of green (Gb), and a fourth color filter of blue (B) are arranged in a repeating pattern. Among primary color filter arrangements, this arrangement provides a high resolution and excellent color reproduction.

Figure 3A:
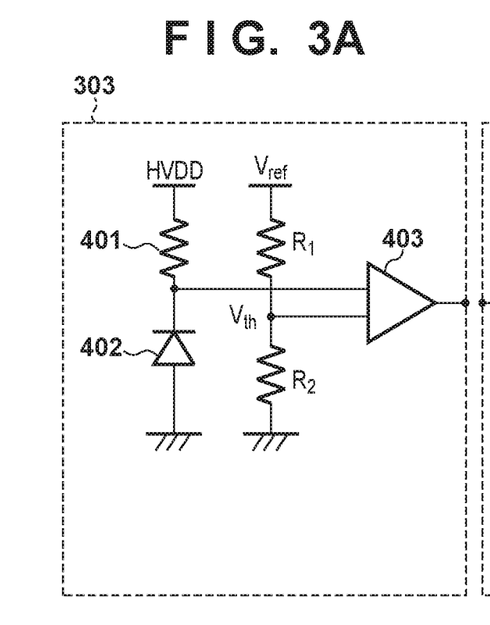
FIGS. 3A and 3B are diagrams illustrating a configuration of a pixel and a part of a pixel calculation unit according to a first embodiment.
Figure 3B:
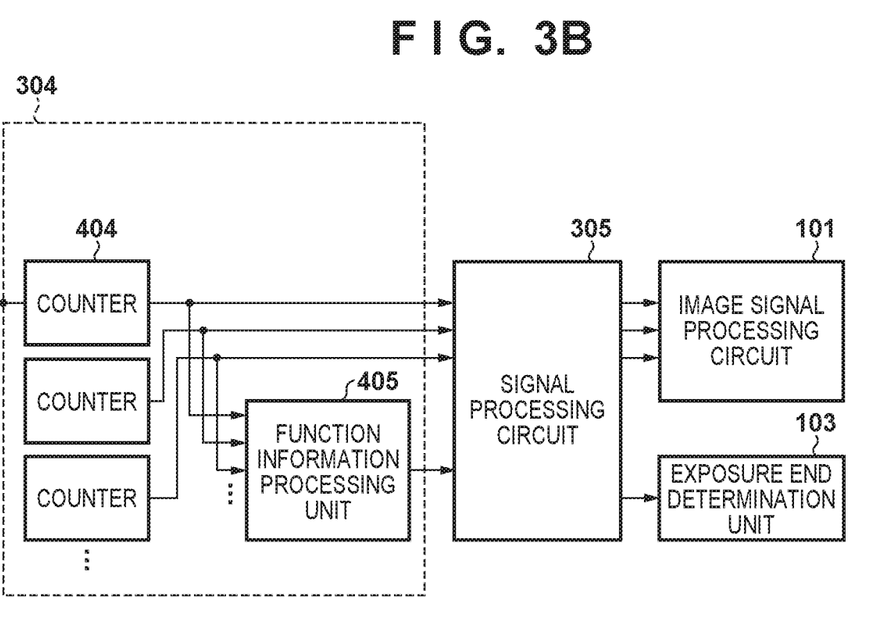

Next, with reference to FIGS. 3A and 3B, the pixel 303 and a partial configuration of the pixel computation unit 304 will be described. FIGS. 3A and 3B show an equivalent circuits of the pixel 303 on the sensor substrate 301 and a part of the pixel computation unit 304 on the circuit board 302 corresponding to the pixel 303.

The pixel 303 includes a quenching resistor 401, an APD 402 as a light receiving element, a comparator 403, and resistors $R_1$ and $R_2$ for generating a threshold voltage $V_{th}$, and is arranged on the sensor substrate 301. The other pixels included in the pixel array have the same configuration. The pixel computation unit 304 includes counters 404 each corresponding to each pixel 303, and a function information processing unit 405 connected to the counters 404, and is arranged on the circuit board 302.

An anode terminal of the APD 402 is grounded (GND), while a cathode terminal is connected to the quenching resistor 401. Then, a reverse bias voltage from a voltage HVDD is applied to the APD 402 via the quenching resistor 401. At this time, a voltage difference between the voltage HVDD and GND is set to be greater than or equal to a breakdown voltage for making the APD 402 operate in Geiger mode.

A voltage $V_{APD}$ (output voltage) at the cathode terminal of the APD 402 is input to one input terminal of the comparator 403. A threshold voltage $V_{th}$ obtained by dividing a reference voltage $V_{ref}$ by the resistors $R_1$ and $R_2$ is input to the other input terminal of the comparator 403.

The comparator 403 outputs a pulse signal each time the voltage $V_{APD}$ falls below and then returns above a level of the threshold voltage $V_{th}$. The pulse signal output from the comparator 403 is input to a counter 404 corresponding to each pixel, and the number of the pulse signals is counted. As the counter 404, a circuit such as a binary counter is used, and the maximum value that can be counted by the counter 404 is determined according to the number of bits of the circuit.

The output (count value) from each counter 404 is sent to at least one of the signal processing circuit 305 and the function information processing unit 405. The count value sent directly to the signal processing circuit 305 is sent to the image signal processing circuit 101 as it is.

On the other hand, in a case where the count value is sent to the function information processing unit 405, the function information processing unit 405 generates count information based on the input count value, and outputs the count information to the exposure end determination unit 103 via the signal processing circuit 305. It should be noted that the count information can take various forms depending on the exposure end determination condition described later, and details thereof will be described later.

The exposure end determination unit 103 determines whether or not to end exposure based on the information obtained from the function information processing unit 405, and outputs the information to the readout control circuit 104. If the exposure end determination unit 103 determines that the exposure is not to be ended (continues the exposure), the readout control circuit 104 returns to the process of acquiring the count information again, and repeats the same process. If the exposure end determination unit 103 determines that the exposure is to be ended, the readout control circuit 104 ends the operation of the counter 404 and controls the image sensor 100 so as to read all pixel information.

Figure 4:
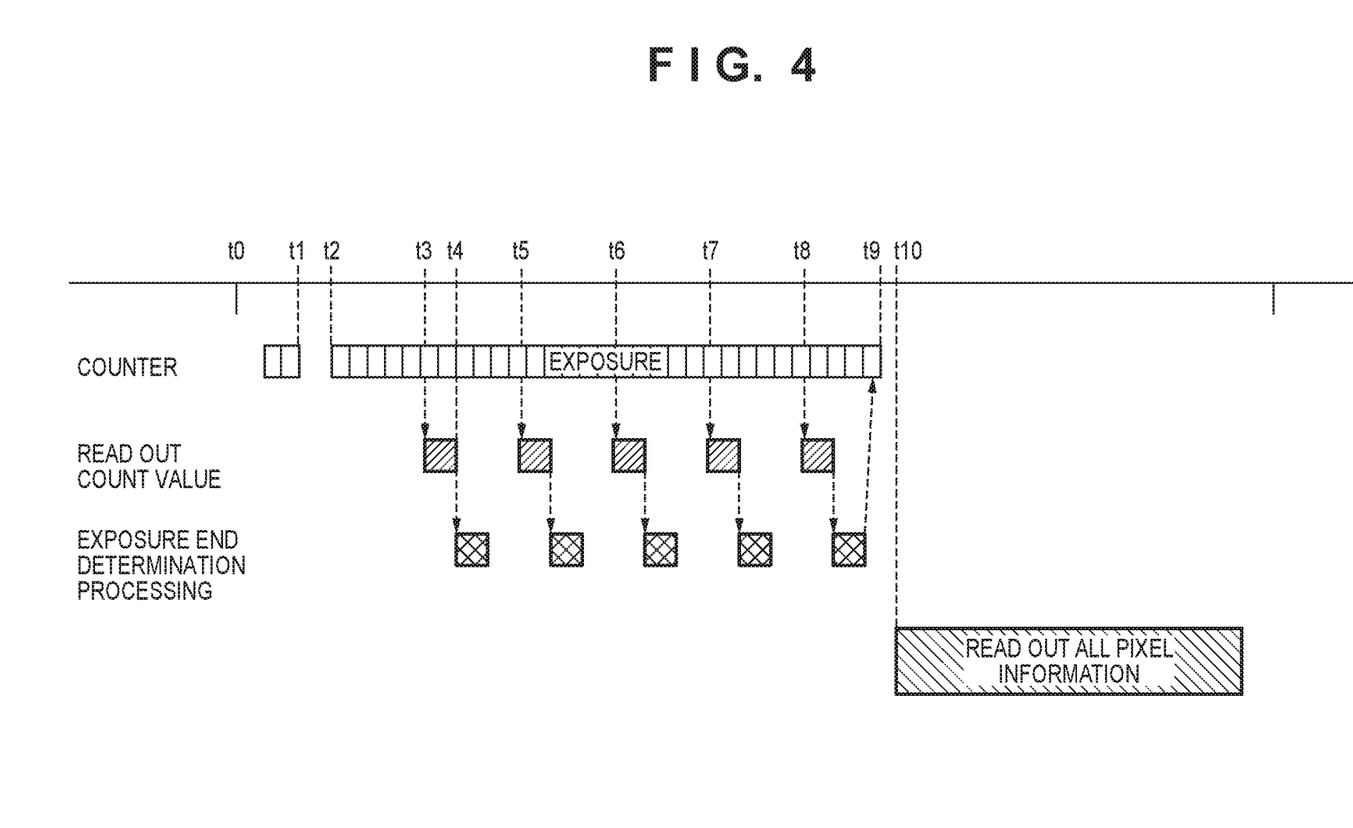
FIG. 4 is a diagram illustrating an operation of a pixel unit according to the first embodiment.
Figure 5:
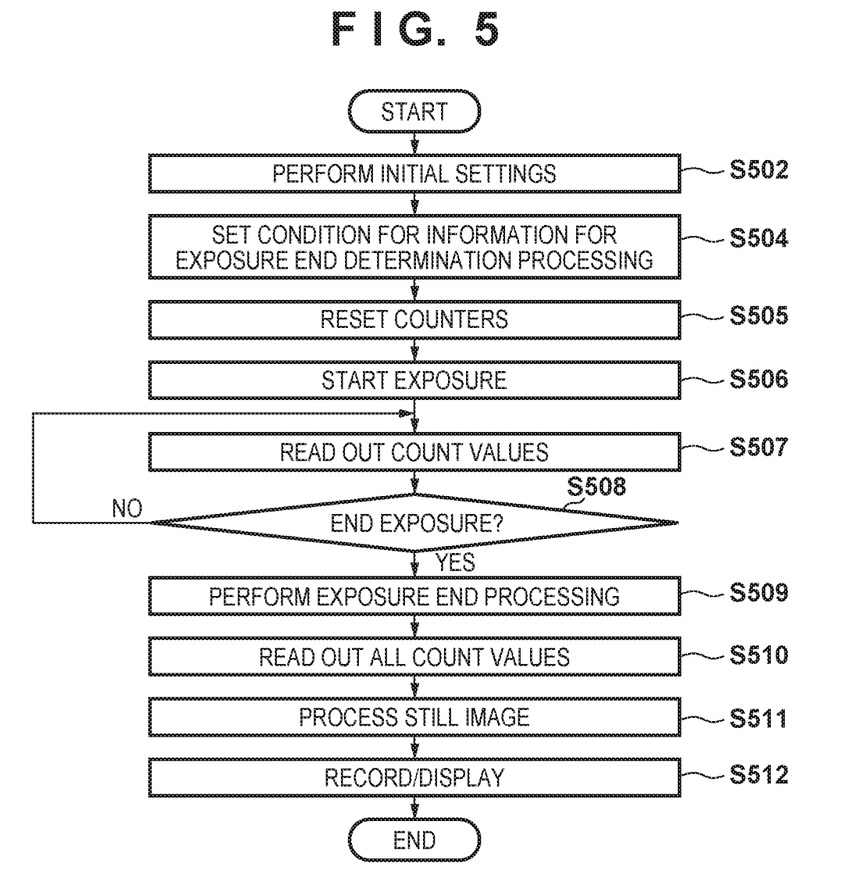
FIG. 5 is a flowchart illustrating an operation of the image capturing apparatus according to the first embodiment.

Next, the operation of the image capturing apparatus according to the present embodiment will be described with reference to the timing chart of FIG. 4 and the flowchart of FIG. 5.

At time t0, the process is started when the user turns on the power button included in the operation unit 110 and further turns on the still image recording button included in the operation unit 110, and in step S502, the overall control and calculation unit 102 performs various initial settings. The initial settings include setting of the ISO sensitivity (shooting sensitivity) to the image sensor 100, setting of the position of the second lens group 118 to the focus drive circuit 112, setting of the aperture value to the aperture drive circuit 113, and the like. Also, a reference for determining the end of exposure is determined.

Next, in step S504, the overall control and calculation unit 102 sets conditions for obtaining count information used for exposure end determination processing in the readout control circuit 104 in order to control the function information processing unit 405.

Information input to the function information processing unit 405 from the counter 404 includes a pixel to be read out and a bit to be read out from the counter 404. In a case where it is desired to monitor the information of all the pixels, it is set so that the count values are read out from the counters 404 of all the pixels. On the other hand, in a case where it is desired to monitor a part of the pixel information such as within the main subject frame and the central photometry area, it is set so that the count values are read out from the counters 404 of the target pixels.

Further, in a case of performing the exposure end determination processing using all the bit information of the counter 404 of each pixel, all the bit information is set to be read out, and in a case of performing the exposure end determination processing using a part of the bit information of the counter 404 of each pixel, only a part of the bit information is set to be read out.

As an example of the processing in a case of using only a part of the bit information for the exposure end determination processing, there is a method of determining the bits to be read out based on the reference value of the exposure end determination processing determined at the time of performing the initial settings in step S502. For example, by monitoring the upper two bits of the counter 404, the overall control and calculation unit 102 can control the readout control circuit 104 so as to end the exposure before the counter 404 reaches the maximum value.

In addition, by using all the bit information for the exposure end determination processing, the exposure can be ended when an arbitrary count value is reached. For example, the exposure may be ended when three quarters of the maximum value of the counter 404 is reached.

After resetting the counters 404 of the image sensor 100 in step S505 (time t1), in step S506, the readout control circuit 104 starts exposing the image sensor 100 according to the exposure conditions (exposure period/aperture/sensitivity) determined by the overall control and calculation unit 102 (time t2). Thus, the APDs 402 start operating, and the counters 404 start counting pulse signals output from the comparators 403.

When a predetermined time has elapsed, in step S507, the function information processing unit 405 reads and processes the count values from the counters 404 based on the conditions set in step S504 (time t3), and outputs count information required by the exposure end determination unit 103. For example, when performing the exposure end determination processing using information of all pixels, the function information processing unit 405 reads the count values from the counters 404 of all pixels. On the other hand, when performing the exposure end determination processing using the information of a part of the pixels, the function information processing unit 405 reads the count values from the counters 404 of a set part of the pixels.

Further, in a case of performing the exposure end determination processing using all the bit information of the counter 404 of each pixel, the function information processing unit 405 reads out all the bit information of the counter 404, and in a case of performing the exposure end determination processing using a part of the bit information of the counter 404 of each pixel, the function information processing unit 405 only reads out necessary bit information.

The function information processing unit 405 may output the necessary information thus read out as count information as it is. Further, in a case where the bit information of any of the counters 404 satisfies a predetermined condition, information (for example, "1") indicating that fact may be output as the count information.

In addition, in a case where the exposure end determination unit 103 makes a determination based on a integration result of the pixel values of the designated area, information obtained by adding information obtained based on the condition set in step S504 may be output as count information. Further, when the exposure end determination unit 103 performs the determination using the information of the largest count value, the largest count value among the input count values may be output as the count information. Alternatively, various types of count information may be output according to conditions.

In step S508, the exposure end determination unit 103 performs the exposure end determination processing based on the count information output from the function information processing unit 405 (time t4). This determination is made based on whether or not the count information output from the function information processing unit 405 satisfies the exposure end determination condition determined at the time of performing the initial settings in step S502.

For example, a following configuration may be considered. Namely, in a case where the determination is made based on the integration result of the designated area based on the value of the upper two bits, in step S507, the function information processing unit 405 reads the values of the upper two bits of the counter 404 of each pixel, integrates the count values of the pixels in a designated area, and outputs the integrated value as the count information. At this time, the exposure end determination unit 103 compares the obtained integral value with a predetermined threshold value, and determines whether or not to end the exposure based on whether or not the integrated value has reached the threshold value. As described above, various other processing contents of the function information processing unit 405 and various other determination methods of the exposure end determination unit 103 may be considered.

If the exposure is to be ended, the process advances to step S509 to end the exposure and stop counting by the counters 404 (time t9). If the exposure is not to be ended, the process returns to step S507 to continue the exposure and repeat the exposure end determination processing (times t5, t6, t7, t8).

When the exposure is ended in step S509, in step S510, all bit information is read from the counters 404 of all the pixels 300 to obtain still image information. Note that the information (count value) read here is sent from the counters 404 to the image signal processing circuit 101 directly through the signal processing circuit 305, where it is processed and converted into image data.

In step S511, the overall control and calculation unit 102 performs various image data processing and correction processing on the image data, such as low-pass filter processing for reducing noise, shading correction processing, and WB correction processing, as development processing of a still image.

In step S512, the image data processed in step S511 is recorded as still image data in the recording medium 108, or used for a live view display on the display unit 107, and the process ends.

According to the first embodiment as described above, it is possible to reduce the amount of data communication with the image sensor 100 by reading out only the information necessary for the exposure end determination processing from the counters. This makes it possible to shorten the interval at which the exposure end determination processing is performed, and to end the exposure without greatly deviating from the reference for the exposure end determination processing.

In the present embodiment, it is assumed that the image sensor 100 is a stacked sensor, and the function information processing unit 405 is provided in the image sensor 100. However, the present invention is not limited to this.

Further, in the present embodiment, the exposure end determination unit 103 and the readout control circuit 104 are independently provided. However, the present invention is not limited to this, and may be included in the image sensor 100. In that case, the image capturing device is configured by the image sensor 100 alone.

Second Embodiment

Next, a second embodiment of the present invention will be described. Note that the configuration of the image capturing apparatus in the second embodiment is the same as that described with reference to FIGS. 1 to 3B, and a description thereof will be omitted here.

The second embodiment differs from the first embodiment in the exposure end determination processing. In the first embodiment, at the time of initial settings (step S502), the reference of the exposure end determination processing is determined, and whether or not the count information output from the function information processing unit 405 exceeds the reference is determined to control the exposure end timing.

In contrast, in the second embodiment, the count information output from the function information processing unit 405 is displayed on the display unit 107, and the exposure end timing is controlled by a user operation. Below, the operation of the image capturing apparatus in the second embodiment will be described with reference to the flowchart of FIG. 6. Note that the same processes as those described in the first embodiment illustrated in FIG. 5 are denoted by the same reference numerals, and description thereof will be omitted as appropriate.

Figure 6:
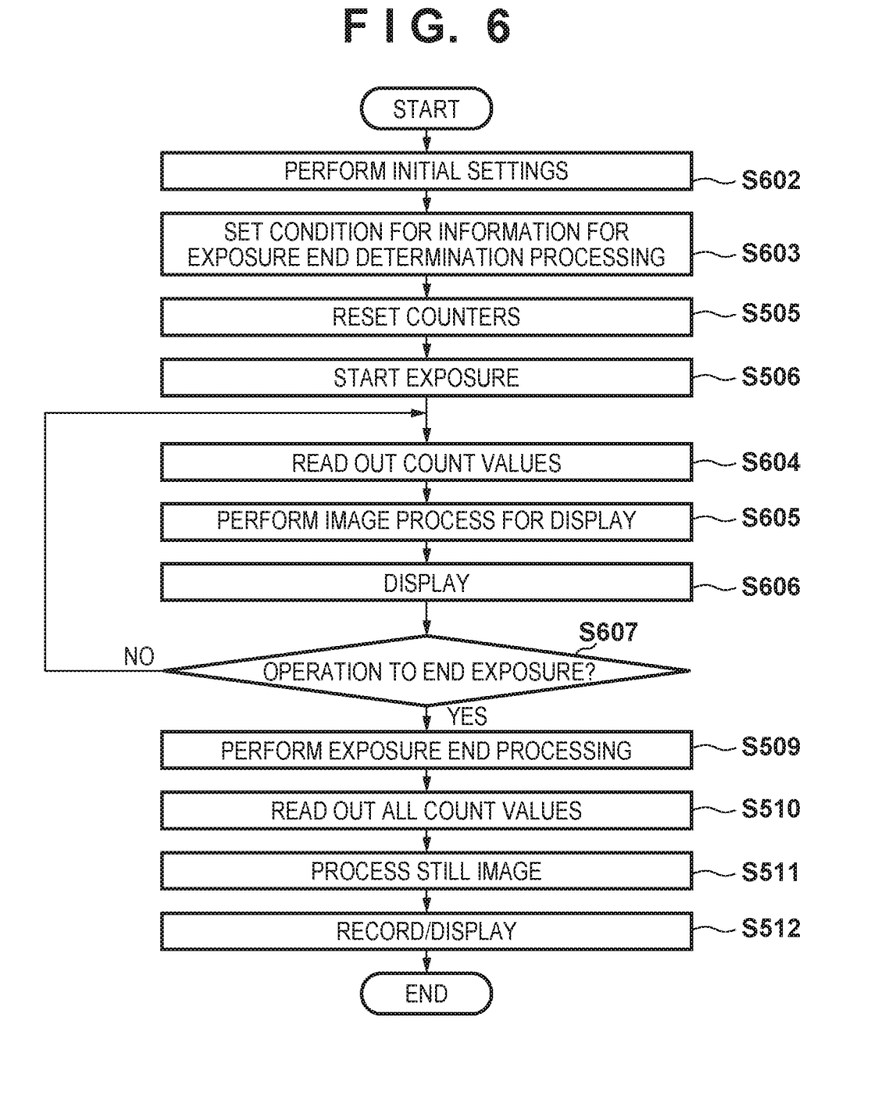
FIG. 6 is a flowchart illustrating an operation of the image capturing apparatus according to a second embodiment.

When the user turns on the power button included in the operation unit 110 and further turns on the still image recording button included in the operation unit 110, the process is started, and the overall control and calculation unit 102 performs various initial settings (step S602). The initial settings here include setting of the ISO sensitivity (shooting sensitivity) to the image sensor 100, setting of the position of the second lens group 118 to the focus drive circuit 112, setting of the aperture value to the aperture drive circuit 113, and the like. Note that, in the first embodiment described above, the process of determining the reference of the exposure end determination is performed at this timing of performing the initial settings, but is not performed in the second embodiment.

Next, in step S603, the function information processing unit 405 is controlled by setting conditions to be input to the image signal processing circuit 101. The count information input to the image signal processing circuit 101 includes a pixel to be read out and a bit/bits to be read out from the counters 404, as in the first embodiment. At this time, in the present embodiment, since the user checks the count values of the counters 404 in the display unit 107 and performs an exposure end operation from the operation unit 110, the function information processing unit 405 does not perform processing such as integration, and outputs the count information based on the conditions set in step S603 as it is. However, in a case where information on all pixels is not necessary, such as in a case where the number of pixels of the display unit 107 is small, the conditions of the pixels to be read out are set so that pixel addition processing and/or thinning processing is performed.

Subsequently, after resetting the counters 404 of the image sensor 100 in step S505, the exposure of the image sensor 100 is started in step S506.

In step S604, the function information processing unit 405 reads the count values from the counters 404 based on the conditions set in step S603, and outputs the count information to the image signal processing circuit 101. In step S605, the overall control and calculation unit 102 performs various image data processing and correction processing on the image data, such as low-pass filter processing for reducing noise, shading correction processing, and WB correction processing, as development processing of a still image, and a live view display of the processed image data is performed on the display unit 107 in step S606.

In step S607, it is determined whether or not the user has turned off the still image recording button included in the operation unit 110. If the still image recording button is turned off, the process advances to step S509 to end the exposure and stop counting by the counters 404. If the still image recording button is not turned off, the process returns to step S604 to continue the exposure, and repeats the exposure end determination processing.

Then, similarly to the first embodiment, the processes of steps S509 to S512 are performed, and the processing ends.

According to the second embodiment as described above, it is possible to reduce the amount of data communication with the image sensor 100 by reading out only the information necessary for the exposure end determination processing from the counters, and in addition, it is possible to end exposure at a timing desired by a user.

Third Embodiment

Next, a third embodiment of the present invention will be described. Note that the configuration of the image capturing apparatus in the second embodiment is the same as that described with reference to FIGS. 1 to 3B, and a description thereof will be omitted here.

The third embodiment differs from the first embodiment in the start timing of the exposure end determination processing, namely a timing of performing first exposure end determination processing. In the first embodiment, immediately after the start of exposure of the image sensor 100 (step S506), information (count values) for the exposure end determining processing is read out (step S507), and the exposure end determining processing is determined (step S508). In contrast, in the third embodiment, the timing of start reading the information for the exposure end determination processing is changed based on image information, obtained prior to the start of the still image recording operation, for the AE (Automatic Exposure) calculation. The operation of the image capturing apparatus in the third embodiment will be described below with reference to the flowchart in FIG. 7. Note that the same processes as those described in the first embodiment illustrated in FIG. 5 are denoted by the same reference numerals, and description thereof will be omitted as appropriate.

Figure 7:
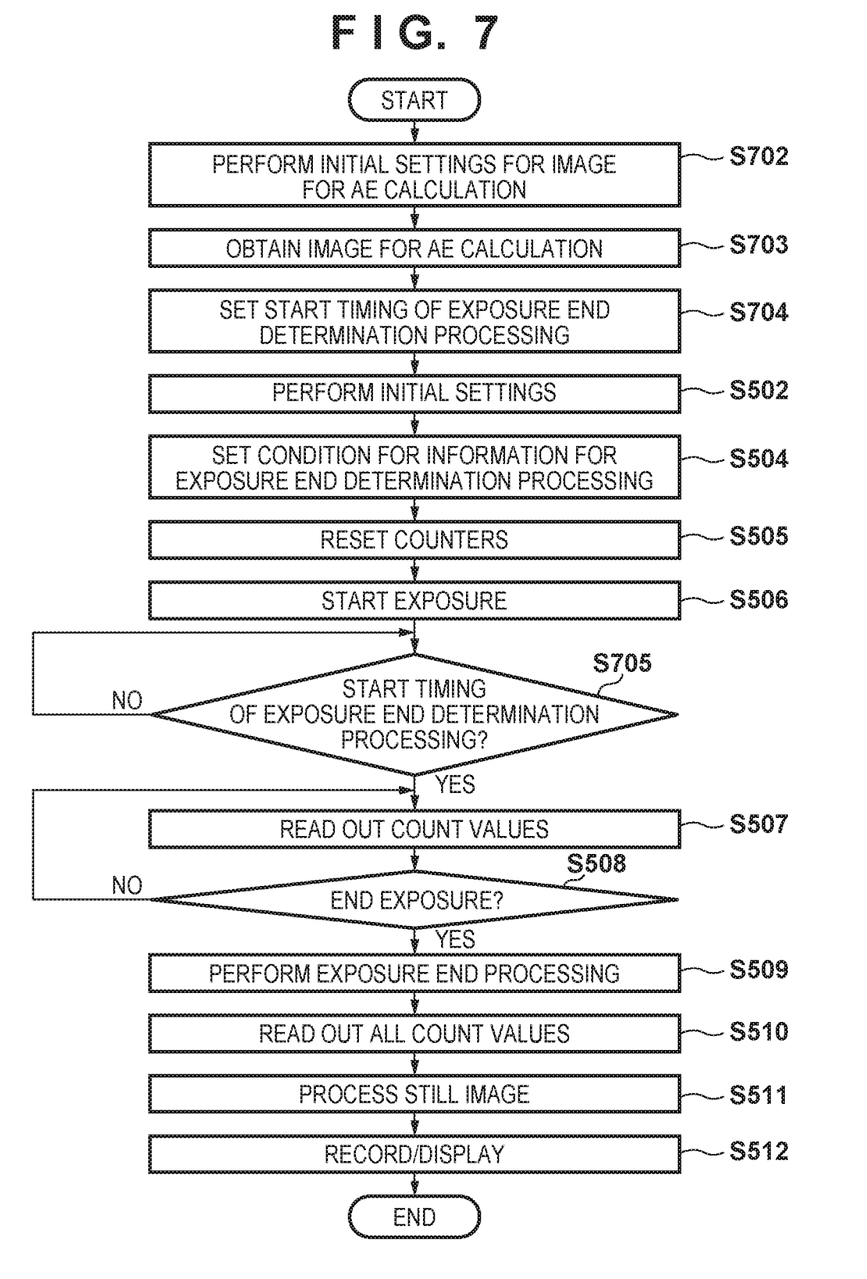
FIG. 7 is a flowchart illustrating an operation of the image capturing apparatus according to a third embodiment.

When the user turns on the power button included in the operation unit 110 and further turns on the still image recording button included in the operation unit 110, the process is started, and the overall control and calculation unit 102 performs various initial settings of an image for an AE calculation (step S702). The initial settings here include setting of the ISO sensitivity (shooting sensitivity) to the image sensor 100, setting of the position of the second lens group 118 to the focus drive circuit 112, setting of the aperture value to the aperture drive circuit 113, and the like. At this time, the acquisition area of an image for the AE calculation is determined by the overall control and calculation unit 102 according to the photometric conditions of the image capturing apparatus. Then, the image for AE calculation is captured (step S703). The image acquired here may be used for a live view display on the display unit 107 as a standby image before a still image shooting.

In step S704, the start timing of the exposure end determination processing is set using the image for AE calculation acquired in step S703. First, the overall control and calculation unit 102 obtains the increasing speed of the count value (increasing speed: speed at which the count value is increasing) corresponding to each pixel 303 from the initial settings of the image for AE calculation set in step S702 and a pixel integration value of the image for AE calculation acquired in step S703. The start timing of the exposure end determination processing is determined based on the increasing speed of the count value and an exposure period whose end is predicted under the shooting conditions (ISO sensitivity, TV (shutter speed), exposure, etc.) at the time of still image shooting. Here, the time from the start of exposure of the image sensor 100 is determined.

Then, the processes of steps S502, S504, S505 and S506 are performed similarly to the first embodiment, and the process proceeds to step S705.

In step S705, it is determined whether or not the start time of the exposure end determination processing determined in step S704 has elapsed since the exposure of the image sensor 100 was started in step S506. If it has elapsed, the processes of S507 to S512 are performed as in the first embodiment, and the process illustrated in FIG. 7 ends. If it has not elapsed, step S705 is repeated, and the process waits until the start time of the exposure end determination processing has elapsed.

As described above, according to the third embodiment, an image for AE calculation is acquired before starting the image shooting operation, and the start timing of the exposure end determination processing is set. By doing so, in addition to the same effect as in the first embodiment, it is possible to reduce the number of times of performing the exposure end determination processing, which can lead to power saving of the image capturing apparatus.

In the third embodiment, only the start timing of the exposure end determination processing is set, and thereafter, the exposure end determination process is periodically performed. However, the present invention is not limited to this. After starting the exposure end determination processing, the increasing speed of the count value corresponding to each pixel 303 may be obtained again using information for the exposure end determination processing read in step S507, and the frequency of performing the exposure end determination processing may be changed depending upon the increasing speed of the count value.

Fourth Embodiment

Next, a fourth embodiment of the present invention will be described. Note that the configuration of the image capturing apparatus in the fourth embodiment is the same as that described with reference to FIGS. 1 to 3B, and a description thereof will be omitted here.

It takes some time until the readout control circuit 104 actually stops counting by the counters 404 and controls to end the exposure of the image sensor 100 after the exposure end determination unit 103 determines to end the exposure. Hereinafter, the time taken here is referred to as "exposure end time lag".

In other words, even after the exposure end determination unit 103 determines to end the exposure, the exposure of the image sensor 100 continues for the exposure end time lag. Therefore, it is necessary for the exposure end determination unit 103 to determine to end the exposure before the target brightness is actually reached. However, the amount of exposure (the progress of the counter 404) during the exposure end time lag differs depending on the luminance of the subject.

Therefore, in the fourth embodiment, a process of changing the reference value of the exposure end determination processing is performed using the count value acquired during the main image exposure.

The fourth embodiment differs from the first embodiment in the method of setting a reference value in the exposure end determination processing. In the first embodiment, a reference value of the exposure end determination processing is determined at the time of performing initial settings (step S502). By contrast, in the fourth embodiment, the reference value of the exposure end determination processing set in step S502 is changed based on the increasing speed of the count value obtained from the information for the exposure end determination obtained during the still image recording operation.

Figure 8:
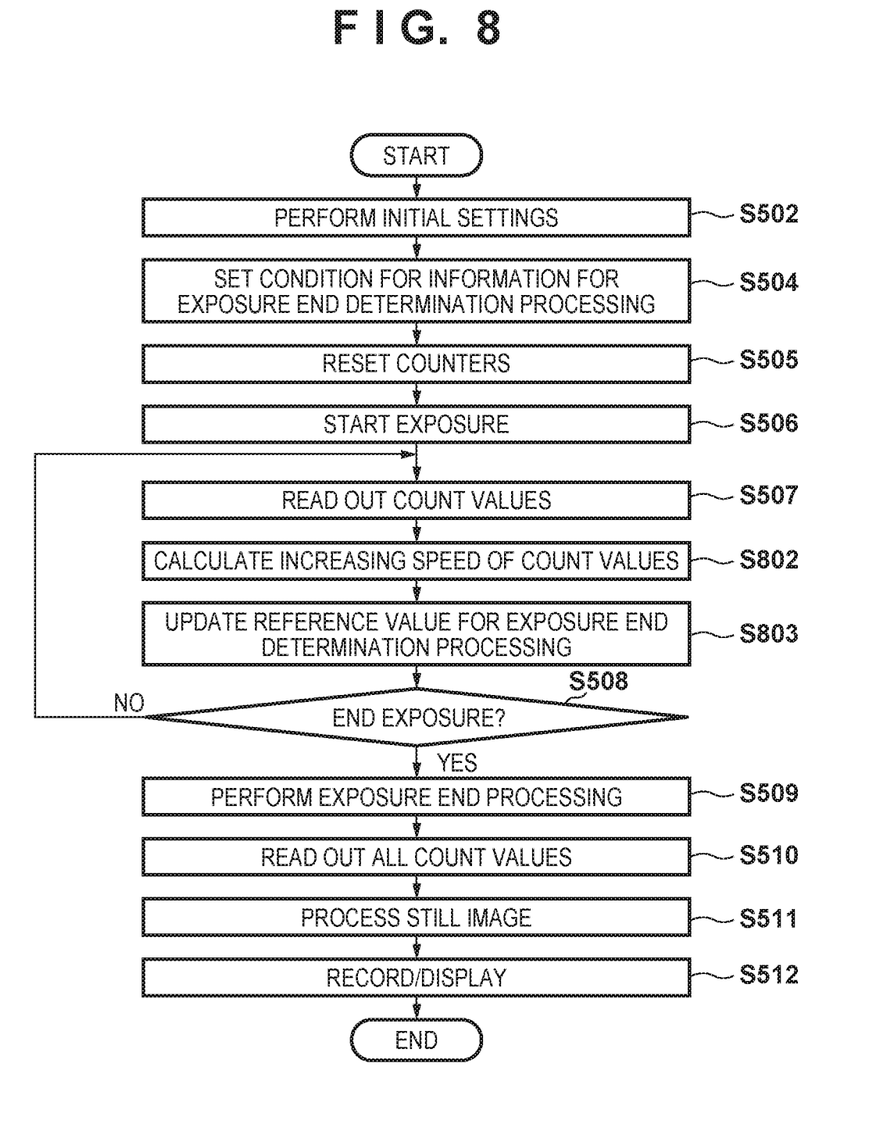
FIG. 8 is a flowchart illustrating an operation of the image capturing apparatus according to a fourth embodiment.

The operation of the image capturing apparatus in the fourth embodiment will be described below with reference to the flowchart in FIG. 8. Note that the same processes as those described in the first embodiment illustrated in FIG. 5 are denoted by the same reference numerals, and description thereof will be omitted as appropriate.

First, the processes of step S502 to S507 performed after the power button (not shown) included in the operation unit 110 is turned on by the user is the same as the processes in the first embodiment.

When the count values are read from the counters 404 for the exposure end determination processing in step S507, in the next step S802, the increasing speed of the count values is calculated from the count values read in step S507. Subsequently, in step S803, the reference value used in the exposure end determination processing is updated based on the increasing speed of the count values obtained in step S802.

Here, the reference value is changed by reducing the reference value by a value obtained by multiplying the exposure end time lag by the increasing speed of the count values, so that the desired count values can be obtained at the time of the exposure end processing (when the counting is stopped). This processing makes it possible to prevent an error in the count values due to the exposure end time lag.

Subsequently, the processes of steps S508 to S512 are performed, and the processing in FIG. 8 ends.

According to the fourth embodiment as described above, in addition to the same effects as in the first embodiment, the information acquired for the exposure end determination processing is also used to calculate the increasing speed of the count values, thereby absorbing an error caused by the exposure end time lag and obtaining an image with an exposure amount closer to a desired exposure amount.

Other Embodiments

The present invention may be applied to a system including a plurality of devices or to an apparatus including a single device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-051507, filed on Mar. 19, 2019 which is hereby incorporated by reference herein in its entirety.

What is claimed is:

1. An image capturing device comprising:
   an image sensing element having a plurality of pixels each including a sensor that outputs a pulse signal in response to incident of a photon, and a counter that counts a number of the pulse signals;
   a processor executing computer instructions or circuitry, which cause the image capturing device to operate as:
      a readout unit that reads out count information from the counters; and
      a control unit that controls the readout unit so as to read out the count information from the counters of at least a part of the plurality of the pixels at a predetermined timing during exposure of the pixels;
   wherein the control unit controls the readout unit so as to read out the count information from the counters before exposing the pixels, and controls the predetermined timing based on an increasing speed of count values obtained from the count information.

2. The image capturing device according to claim 1, wherein the processor that executes computer instructions or circuitry further cause the image capturing device to operate as a determination unit that determines whether the read out count information satisfies a predetermined condition,
   wherein, in a case where the predetermined condition is satisfied, counting by the counters is stopped.

3. The image capturing device according to claim 1, wherein the control unit controls timing of reading out the count information for the first time since exposure of the pixels is started based on the increasing speed of the count values.

4. The image capturing device according to claim 1, wherein the control unit controls a frequency of the predetermined timing of reading out the count information based on the increasing speed of the count values.

5. The image capturing device according to claim 1, wherein the control unit obtains the increasing speed of the count values from the count information obtained at the predetermined timing, and controls a frequency of the predetermined timing of reading out the count information based on the increasing speed of the count values.

6. The image capturing device according to claim 2, wherein the predetermined condition is that the count values of the counters reach a predetermined value, and
   wherein the predetermined value is changed based on the increasing speed of the count values and a time lag since the determination unit determines that the predetermined condition is satisfied until the counters stop counting.

7. The image capturing device according to claim 1, wherein the counters are binary counters configured with a plurality of bits, and the control unit reads out predetermined bit information of the binary counters as the count information.

8. The image capturing device according to claim 1, wherein the control unit controls the readout unit so as to read out the count information from the pixels included in a predetermined area among the plurality of pixels.

9. The image capturing device according to claim 1, wherein the sensor includes an avalanche photodiode.

10. The image capturing device according to claim 1, wherein the image capturing device is an image sensor.

11. The image capturing device according to claim 1, wherein the image capturing device is an image capturing apparatus comprising an image sensor including at least the image sensing element.

12. The image capturing device according to claim 1, further comprising
   a display that displays the count information read out by the readout unit under control by the control unit; and
   wherein the processor that executes computer instructions or circuitry further cause the image capturing device to operate as an operation unit that inputs an instruction to stop counting in the counters,
   wherein, in a case where the instruction is input by the operation unit, counting by the counters is stopped.

* * * * *